United States Patent
Wagner et al.

(10) Patent No.: US 7,508,262 B1
(45) Date of Patent: Mar. 24, 2009

(54) ENVELOPE ELIMINATION AND RESTORATION AMPLIFIER HARMONIC ENERGY RECOVERY SYSTEM AND METHOD

(75) Inventors: Paul K. Wagner, Marion, IA (US); Kil S. Kim, Freehold, NJ (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 131 days.

(21) Appl. No.: 11/523,843

(22) Filed: Sep. 20, 2006

(51) Int. Cl.
*H03G 3/20* (2006.01)
(52) U.S. Cl. .................. 330/136; 330/129; 330/140
(58) Field of Classification Search .............. 330/127, 330/129, 136, 140, 138; 455/127.1
See application file for complete search history.

(56) References Cited

U.S. PATENT DOCUMENTS 6,549,068 B1 * 4/2003 Bollenbeck .............. 330/129

OTHER PUBLICATIONS

Zhang, et al "Analysis of Power Recycling Techniques for RF and Microwave Outphasing Power Amplifiers," IEEE Transactions on Circuits and Systems—II: Analog and Digital Signal Processing, vol. 49, No. 5, May 2002 (pp. 312-320).

* cited by examiner

*Primary Examiner*—Khanh V Nguyen

(57) ABSTRACT

A radio frequency (RF) amplifier system uses an envelope elimination and restoration (EER) amplifier having at least one carrier input, at least one power input, and at least one amplifier output carrying an amplified signal. The RF amplifier system disclosed also uses a diplexer receiving the amplified signal and filtering the amplified signal, the diplexer having at least one RF output and at least one harmonic energy output. Further, the RF amplifier system uses a harmonic energy recovery circuit. The harmonic energy recovery circuit is coupled to the at least one harmonic energy output and the harmonic energy recovery circuit having at least one output coupled to the EER amplifier.

17 Claims, 3 Drawing Sheets

ENVELOPE ELIMINATION AND RESTORATION AMPLIFIER HARMONIC ENERGY RECOVERY SYSTEM AND METHOD

GOVERNMENT LICENSE RIGHTS

The U.S. Government has a paid-up license in this invention and the right in limited circumstances to require the patent owner to license others on reasonable terms as provided for by the terms of Government Contract No. W15P7T-04-C-E405.

BACKGROUND

The invention generally relates to a power recycling technique used to enhance the efficiency of radio-frequency (RF) amplifiers based on the Envelope Elimination and Restoration (EER) technique.

Linear modulations such as MPSK and MQAM are desired for mobile wireless communications because of their superior spectral efficiency, but they require linear power amplification at transmission. On the other hand, limited battery capacity imposes primary restrictions on the power consumption of the typical mobile handset, and even base station power amplifiers have limited DC power availability. In a typical transceiver architecture, it is typically the final power amplifier stage that constitutes these real challenges for the designer. Many linearization techniques have been proposed to improve the linearity of the power amplifiers while at the same time enhancing the power efficiency. Often there may be energy lost in filtering of high frequency harmonics, and thus it is desirable to minimize these losses for power efficiency.

In Conventional Envelope Elimination and Restoration (EER) RF amplifier design (as depicted in FIG. 1), the modulated signal is separated into carrier 110 and envelope 120 components. Each of these components is amplified in a power-efficient manner by EER 130 and then recombined to create the amplified RF output 140. Processing of the carrier component is performed by a saturated amplifier 150; as a result, output 160 prior to filtering contains the modulation imposed on a square-wave carrier.

Diplexer 170 following saturated amplifier 150 has two functions: (1) lowpass filter—the amplified content to provide harmonic and broadband noise reduced spectral content for transmission by a lowpass filter 180, and (2) high pass filter—the amplified content, by a highpass filter 190, to direct the harmonic and broadband noise to a termination at load 195. In addition, diplexer 170 assures that saturated amplifier 130 sees a constant load impedance independent of frequency.

From Fourier series theory, the power in the fundamental component of a square wave comprises 81% of its total power, and the harmonic components comprise the remaining 19% of its total power. As an example, assuming the diplexer filters are lossless, 25 watts of square-wave energy would yield about 20 watts of desired fundamental component RF output energy and about 5 watts of undesired harmonic energy dissipated in the load.

If the harmonic energy dissipated in the load can be recovered and used to help power the RF amplifier, then the amount of DC power required would be reduced and the overall power efficiency of the amplifier would increase. Reduced power consumption also reduces the amount of thermal dissipation required, which in turn reduces the amplifier's size and weight.

Accordingly, there is a need for a power recycling technique to enhance the efficiency of radio-frequency (RF) amplifiers based on the Envelope Elimination and Restoration (EER) technique. There is a need for a technique which uses a "harmonic energy recovery" circuit, in which a portion of the power wasted in harmonic content generation can be recovered, allowing the amplifier to draw less DC power and thus be more power-efficient, as well as potentially smaller in size and weight due to a requiring a lower thermal mass.

The techniques herein below extend to those embodiments which fall within the scope of the appended claims, regardless of whether they accomplish one or more of the above-mentioned needs.

SUMMARY

What is provided is a radio frequency (RF) amplifier system. The radio frequency amplifier system comprises an envelope elimination and restoration (EER) amplifier having at least one carrier input, at least one power input, and at least one amplifier output carrying an amplified signal. The RF amplifier system also comprises a diplexer receiving the amplified signal and filtering the amplified signal, the diplexer having at least one RF output and at least one harmonic energy output. Further, the RF amplifier system comprises a harmonic energy recovery circuit, the harmonic energy recovery circuit coupled to the at least one harmonic energy output and the harmonic energy recovery circuit having at least one output coupled to the EER amplifier.

What is also provided is a radio transmitter. The radio transmitter comprises a signal processing device generating a carrier signal input. The radio transmitter also comprises an amplifier subsystem receiving the carrier signal input and the amplifier subsystem having a radio frequency signal output. The amplifier subsystem comprises an envelope elimination and restoration (EER) amplifier being coupled to the carrier input, a power input, and an amplifier output carrying an amplified signal. The amplifier subsystem also comprises a diplexer receiving the amplified signal and filtering the amplified signal. The diplexer is coupled to the RF output and has a harmonic energy output. The amplifier subsystem also comprises a harmonic energy recovery circuit. The harmonic energy recovery circuit is coupled to the harmonic energy output and the harmonic energy recovery circuit has an output coupled to the EER amplifier.

Further what is provided is a method of amplifying an electronic signal for transmission. The method comprises providing a carrier input signal, an envelope input signal, and a DC power input to an envelope elimination and restoration (EER) amplifier. The method also comprises generating an amplified signal by the EER amplifier. Further, the method comprises filtering the amplified signal with the output of the filtering being a radio frequency output signal and a harmonic content output signal. Further still, the method comprises recovering energy from the harmonic content signal and providing at least some of the energy recovered to the EER amplifier.

Alternative exemplary embodiments relate to other features and combination of features as may be generally recited in the claims.

BRIEF DESCRIPTION OF THE DRAWINGS

A better understanding of the features and advantages of the present invention will be obtained by reference to the following detailed description that sets forth illustrative embodiments by way of example only, in which the principles of the invention are utilized, and the accompanying drawings, of which.

DETAILED DESCRIPTION

Figure 1:
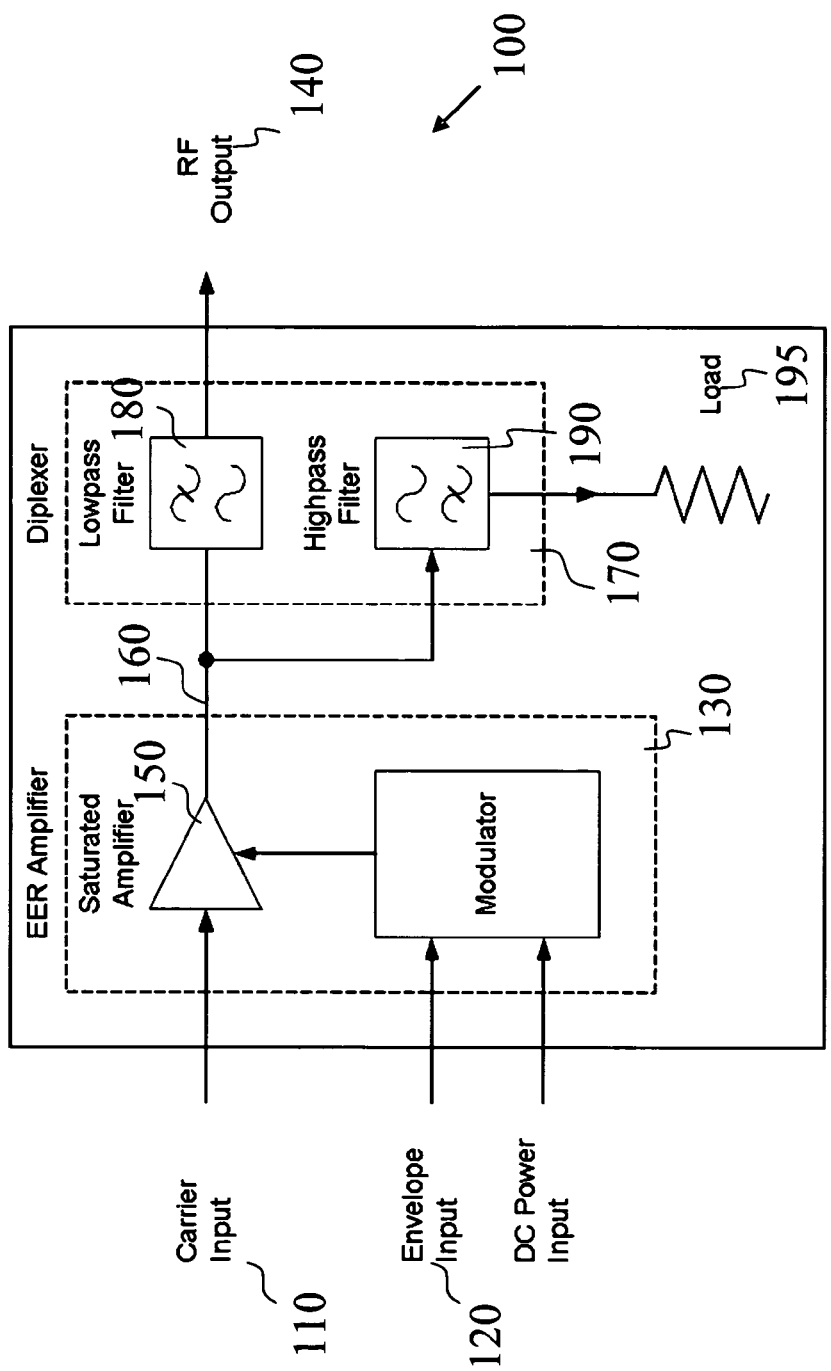
FIG. 1 is an exemplary block diagram of a radio frequency amplifier system of the prior art.
Figure 2:
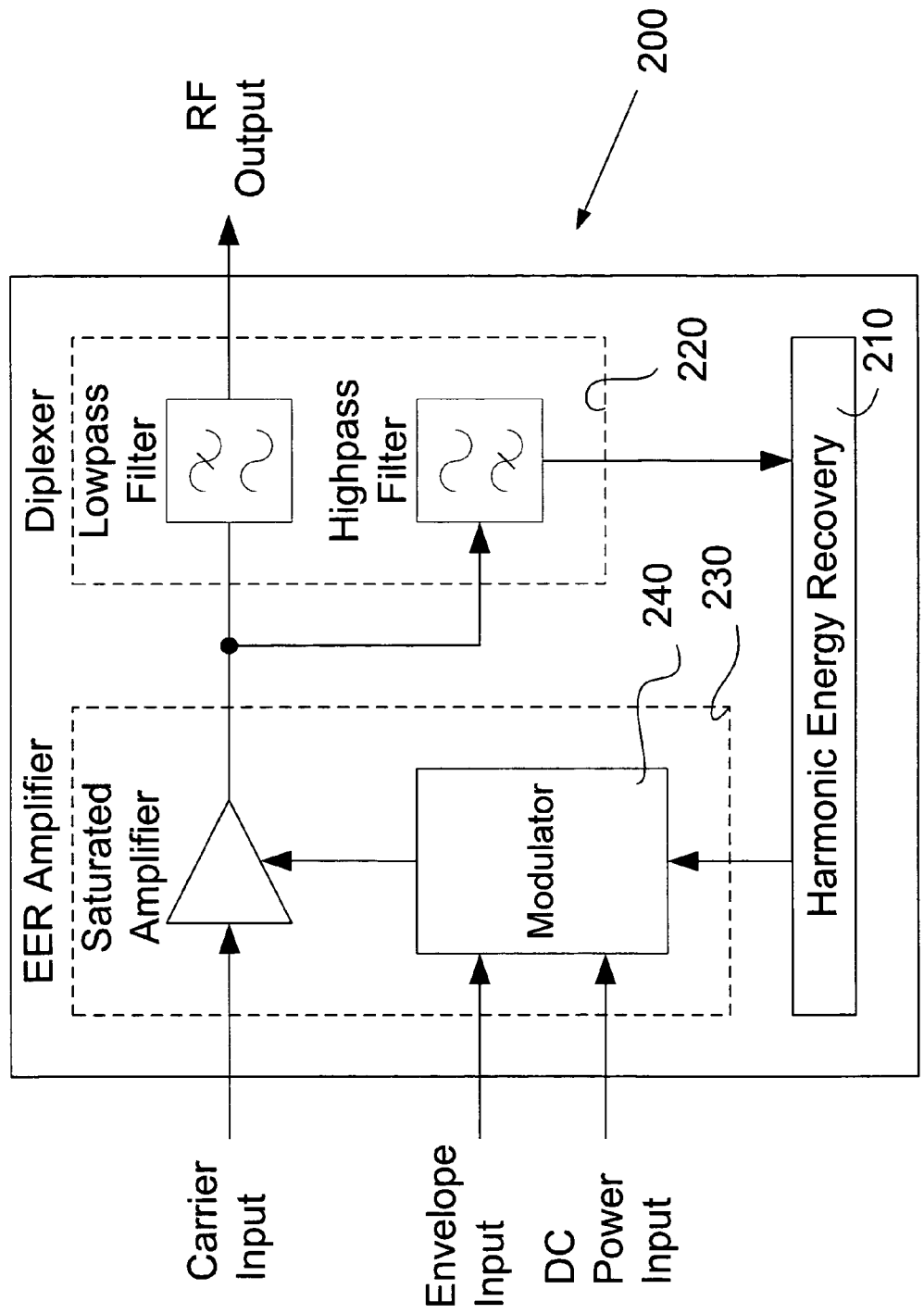
FIG. 2 is an exemplary block diagram of a radio frequency amplifier system in accordance with the invention.

Before describing in detail the particular improved system and method, it should be observed that the invention includes, but is not limited to a novel structural combination of conventional data/signal processing components and communications circuits, and not in the particular detailed configurations thereof. Accordingly, the structure, methods, functions, control and arrangement of conventional components and circuits have, for the most part, been illustrated in the drawings by readily understandable block representations and schematic diagrams, in order not to obscure the disclosure with structural details which will be readily apparent to those skilled in the art, having the benefit of the description herein. Further, the invention is not limited to the particular embodiments depicted in the exemplary diagrams, but should be construed in accordance with the language in the claims.

In accordance with an exemplary embodiment, an exemplary EER Amplifier in the Harmonic Energy Recovery system 200 is depicted. EER Amplifier Harmonic Energy Recovery system 100 comprises a Harmonic Energy Recovery circuit 210 in place of the load 195 depicted in FIG. 1. The harmonic content present at the output of the diplexer 220 highpass filter is processed by a "Harmonic Energy Recovery" circuit 210 and provided to the EER amplifier 230 as a source of DC power. In so doing, the amount of DC power required to power the amplifier is reduced, thus making the amplifier more power-efficient (in the RF output power versus DC input power sense). In accordance with an exemplary embodiment, Harmonic Energy Recovery circuit 210 may be implemented as a rectifier providing a source of DC power to modulator 240 of EER amplifier 230.

An advantage of this technique is that the harmonic energy generated by the EER amplifier is captured and converted to DC energy. This DC energy can be used to help power the amplifier, rather than simply being dissipated in a load. In turn, the EER amplifier becomes more power efficient and requires less thermal energy to be dissipated. Also, the power savings may allow the power source to be smaller in size and weight. This technique has potentially beneficial application in portable and battery-operated RF communications equipment.

Figure 3:
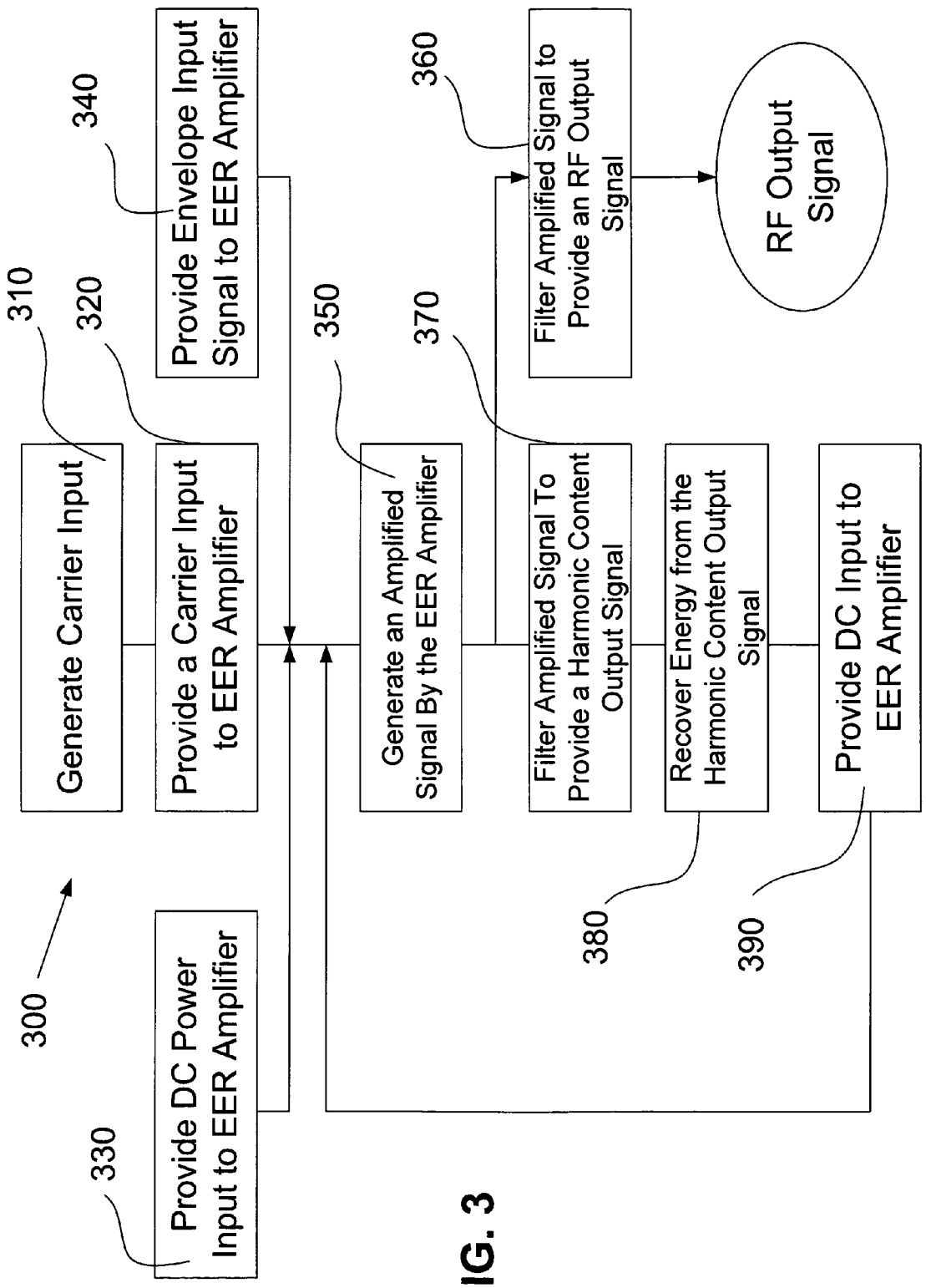
FIG. 3 is an exemplary process diagram in accordance with the invention.

Referring now to FIG. 3, a process 300 of amplifying an electronic signal for transmission is depicted. A carrier input signal is generated (process 310) and provided to the EER amplifier (process 320). DC power input (process 330) and an envelope input signal (process 340) are also provided to the EER amplifier. Process 300 also comprises, generating an amplified signal by the EER amplifier (process 350). The amplified signal is filtered with the output of the filtering being a radio frequency output signal (process 360) and a harmonic content output signal (process 370). Energy is recovered from the harmonic content signal (process 380). At least some of the energy recovered is provided as input to the EER amplifier (process 390).

While the detailed drawings, specific examples, and particular formulations given described exemplary embodiments, they serve the purpose of illustration only. It should be understood that various alternatives to the embodiments of the invention described maybe employed in practicing the invention. It is intended that the following claims define the scope of the invention and that structures within the scope of these claims and their equivalents be covered thereby. The hardware and software configurations shown and described may differ depending on the chosen performance characteristics and physical characteristics of the computing and analysis devices. For example, the type of computing device, communications bus, or processor used may differ. The systems shown and described are not limited to the precise details and conditions disclosed. Method steps provided may not be limited to the order in which they are listed but may be ordered any way as to carry out the inventive process without departing from the scope of the invention. Furthermore, other substitutions, modifications, changes and omissions may be made in the design, operating conditions and arrangements of the exemplary embodiments without departing from the scope of the invention as expressed in the appended claims.

What is claimed is:

1. A radio frequency (RF) amplifier system, comprising:
an envelope elimination and restoration (EER) amplifier having at least one carrier input, at least one power input, and at least one amplifier output carrying an amplified signal;
a diplexer receiving the amplified signal and filtering the amplified signal, the diplexer having at least one RF output and at least one harmonic energy output; and
a harmonic energy recovery circuit, the harmonic energy recovery circuit coupled to the at least one harmonic energy output, having at least one output coupled to the EER amplifier, and including a rectifier.

2. The RF amplifier system of claim 1, wherein the EER amplifier comprises a saturated amplifier.

3. The RF amplifier system of claim 1, wherein the EER amplifier comprises a modulator.

4. The RF amplifier system of claim 1, wherein the diplexer comprises a low pass filter.

5. The RF amplifier system of claim 1, wherein the diplexer comprises a high pass filter.

6. The RF amplifier system of claim 1, wherein the diplexer comprises a low pass filter and a high pass filter.

7. A radio transmitter, comprising:
a signal processing device generating a carrier signal input;
an amplifier subsystem receiving the carrier signal input and the amplifier subsystem having a radio frequency signal output, the amplifier subsystem comprising:
an envelope elimination and restoration (EER) amplifier being coupled to the carrier input, a power input, and an amplifier output carrying an amplified signal;
a diplexer receiving the amplified signal and filtering the amplified signal, the diplexer coupled to the RF signal output and having a harmonic energy output; and
a harmonic energy recovery circuit, the harmonic energy recovery circuit coupled to the harmonic energy output, having an output coupled to the EER amplifier, and including a rectifier.

8. The radio transmitter of claim 7, wherein the EER amplifier comprises a saturated amplifier.

9. The radio transmitter of claim 7, wherein the EER amplifier comprises a modulator.

10. The radio transmitter of claim 7, wherein the diplexer comprises a low pass filter.

11. The radio transmitter of claim 7, wherein the diplexer comprises a high pass filter.

12. The radio transmitter of claim 7, wherein the diplexer comprises a low pass filter and a high pass filter.

13. The radio transmitter of claim 7, wherein the radio transmitter is an electrical subsystem of a mobile communications device.

14. A method of amplifying an electronic signal for transmission, comprising:
   providing a carrier input signal, an envelope input signal, and a DC power input to an envelope elimination and restoration (EER) amplifier;
   generating an amplified signal by the EER amplifier;
   filtering the amplified signal with the output of the filtering being a radio frequency output signal and a harmonic content output signal;
   recovering energy from the harmonic content output signal using signal rectification; and
   providing at least some of the energy recovered to the EER amplifier.

15. The method of claim 14, wherein the EER amplifier comprises a saturated amplifier.

16. The method of claim 14, wherein the EER amplifier comprises a modulator.

17. The method of claim 14, wherein the filtering is carried out in a diplexer.

* * * * *